US009231599B2

(12) United States Patent
Yorita (10) Patent No.: US 9,231,599 B2
(45) Date of Patent: Jan. 5, 2016

(54) OSCILLATION APPARATUS

(71) Applicant: NIHON DEMPA KOGYO CO., LTD., Tokyo (JP)

(72) Inventor: Tomoya Yorita, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 14/098,507

(22) Filed: Dec. 5, 2013

(65) Prior Publication Data

US 2014/0159821 A1    Jun. 12, 2014

(30) Foreign Application Priority Data

Dec. 10, 2012   (JP) ................................. 2012-269526

(51) Int. Cl.
| | |
|---|---|
| *H03B 5/32* | (2006.01) |
| *H03L 7/06* | (2006.01) |
| *H03L 1/04* | (2006.01) |
| *H03H 9/205* | (2006.01) |
| *H03B 5/04* | (2006.01) |
| *H03L 1/02* | (2006.01) |

(52) U.S. Cl.
CPC ......... *H03L 7/06* (2013.01); *H03L 1/026* (2013.01); *H03L 1/04* (2013.01); *H03B 5/04* (2013.01); *H03B 5/32* (2013.01); *H03H 9/205* (2013.01); *H03L 1/028* (2013.01)

(58) Field of Classification Search
CPC ............ H03L 1/04; H03L 1/028; H03L 7/06; H03L 1/026; H03B 5/04; H03B 5/32; H03H 9/205
USPC ............ 331/46, 68, 69, 70, 108 C, 154, 158, 331/162, 176
See application file for complete search history.

(56) References Cited

U.S. PATENT DOCUMENTS

| | | | | |
|---|---|---|---|---|
| 5,917,272 | A  * | 6/1999 | Clark et al. | 310/343 |
| 7,369,004 | B2 * | 5/2008 | Partridge et al. | 331/156 |
| 7,915,965 | B2 * | 3/2011 | Hardy et al. | 331/65 |
| 8,830,004 | B2 * | 9/2014 | Koyama et al. | 331/66 |
| 2005/0012561 | A1 * | 1/2005 | Young et al. | 331/176 |

FOREIGN PATENT DOCUMENTS

| | | |
|---|---|---|
| JP | 2001-127588 | 5/2001 |
| JP | 2010-154227 | 7/2010 |
| JP | 2011-199335 | 10/2011 |
| JP | 2012-170050 | 9/2012 |
| JP | 2013-051676 | 3/2013 |
| JP | 2013-051677 | 3/2013 |
| JP | 2013-143601 | 7/2013 |

* cited by examiner

*Primary Examiner* — Richard Tan
(74) *Attorney, Agent, or Firm* — Jianq Chyun IP Office (57) ABSTRACT

An oscillation apparatus corrects a setting value for an output frequency based on a detection result of an environmental temperature. The oscillation apparatus includes a first crystal unit, a second crystal unit, an integrated circuit chip, and a container. The first crystal unit includes first excitation electrodes on respective surfaces of a crystal element. The second crystal unit includes second excitation electrodes on respective surfaces of a crystal element. The integrated circuit chip includes a first oscillation circuit, a second oscillation circuit, and a correction unit. The container houses the first crystal unit, the second crystal unit, and the integrated circuit chip. Assuming that distances from a gravity center position of the integrated circuit chip to respective gravity center positions of the first excitation electrodes and the second excitation electrodes in plan view are denoted by D1 and D2, D1/D2 is within a predetermined range close to 1.

18 Claims, 9 Drawing Sheets

OSCILLATION APPARATUS

CROSS REFERENCE TO RELATED APPLICATIONS

This application claims the priority benefit of Japan application serial no. 2012-269526, filed on Dec. 10, 2012. The entirety of the above-mentioned patent application is hereby incorporated by reference herein and made a part of this specification.

TECHNICAL FIELD

This disclosure relates to an oscillation apparatus that includes a first crystal unit, a second crystal unit, and an integrated circuit chip within a container.

DESCRIPTION OF THE RELATED ART

A crystal unit used for a crystal oscillator has a frequency versus temperature characteristic where an oscillation frequency changes corresponding to the temperature. Accordingly, in the case where the crystal unit is used in an application requiring a high frequency characteristic, an oven controlled crystal oscillator (OCXO) or a temperature compensated crystal oscillator (TCXO) are used for example. The TCXO is inferior in frequency stability compared with the OCXO, but has a feature of a simple structure and small power consumption. These are selected depending on the usage.

The inventor has been investigating that a temperature is computed using a frequency difference between two crystal units in the TCXO or the OCXO and then a frequency variation is corrected with the temperature. In Japanese Unexamined Patent Application Publication No. 2012-170050 (hereinafter referred to as Patent Literature 1), the following technique is proposed. In the TCXO, a common crystal element is used to constitute first and second crystal units. A frequency correction value is obtained from a frequency difference between these crystal units. In this technique, first and second oscillation circuits respectively connected to the first and second crystal units are assumed to have respective oscillation outputs of f1 and f2. At a reference temperature, the first and second oscillation circuits are assumed to have respective oscillation frequencies of f1r and f2r. The difference between: a value corresponding to the difference between f1 and f1r, and a value corresponding to the difference between f2 and f2r, is a frequency difference that is used as the temperature at that time. The frequency correction value is obtained by polynomial approximation based on this frequency difference.

This TCXO is manufactured as follows. For example, a frequency characteristic is obtained for each crystal unit to make the correction data. Subsequently, the crystal units and an integrated circuit chip (LSI), which includes the oscillation circuits and a temperature compensation circuit, are mounted on a printed circuit board. However, when operating time of the crystal oscillator becomes long, an error may occur in a correction value of the oscillation frequency and stability of the oscillation frequency may be reduced. This is inferred because the integrated circuit chip generates heat by the operation of the crystal oscillator and this heat causes the difference in temperature between the two crystal units. That is, the above-described configuration is based on the premise that the two crystal units have the same temperature. Therefore, if there is a difference in temperature between the two crystal units, the correspondence relationship with the correction data breaks down and then an error occurs in the correction value.

In paragraph 0004 and FIG. 9 of Japanese Unexamined Patent Application Publication No. 2001-127588 (hereinafter referred to as Patent Literature 2), the following configuration is disclosed. In a surface acoustic wave branching device, two surface acoustic wave filter elements are mounted on a base substrate. Between these elements, lumped constant circuit elements are disposed. In paragraphs 0025 to 0030 and FIG. 1 of Japanese Unexamined Patent Application Publication No. 2010-154227 (hereinafter referred to as Patent Literature 3), the following technique is disclosed. A constant-temperature crystal oscillator includes a first circuit board on which a crystal unit is disposed and a third circuit board at a distance from the first circuit board. In the third circuit board, a buffer stage and a circuit element of a temperature control circuit are disposed. This reduces the heat influence on the buffer stage and similar member so as to prevent deterioration in characteristics. In paragraph 0017 and FIG. 1 of Japanese Unexamined Patent Application Publication No. 2011-199335 (hereinafter referred to as Patent Literature 4), the following technique is disclosed. In a voltage-controlled piezoelectric oscillator, an insulating substrate includes a piezoelectric resonator on one surface side and a temperature control circuit on the other surface side. The temperature control circuit controls a heating element in a temperature range equal to or less than the ordinary temperature in the piezoelectric resonator. In a temperature range equal to or more than the ordinary temperature, the frequency versus temperature characteristic of the piezoelectric resonator is used.

However, Patent Literature 1 to Patent Literature 4 do not disclose a technique for improving frequency stability in an oscillation apparatus that includes two crystal units. Therefore, it is difficult to solve the problem of this disclosure based on Patent Literature 1 to Patent Literature 4.

A need thus exists for an oscillation apparatus which is not susceptible to the drawback mentioned above.

SUMMARY

An oscillation apparatus of this disclosure corrects a setting value for an output frequency based on a detection result of an environmental temperature. The oscillation apparatus includes a first crystal unit, a second crystal unit, an integrated circuit chip, and a container. The first crystal unit includes first excitation electrodes on respective surfaces of a first crystal element. The second crystal unit includes second excitation electrodes on respective surfaces of a second crystal element. The integrated circuit chip includes a first oscillation circuit, a second oscillation circuit, and a correction unit. The first oscillation circuit and the second oscillation circuit are respectively connected to the first crystal unit and the second crystal unit. The correction unit is configured to provide a signal corresponding to a difference in oscillation frequency between the first oscillation circuit and the second oscillation circuit as a detection result of a temperature and to correct a setting value for an output frequency of the first oscillation circuit based on the detection result. The container houses the first crystal unit, the second crystal unit, and the integrated circuit chip. Assuming that distances from a gravity center position of the integrated circuit chip to respective gravity center positions of the first excitation electrodes and the second excitation electrodes in plan view are denoted by D1 and D2, D1/D2 is within a predetermined range close to 1.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

First Embodiment

Figure 1:
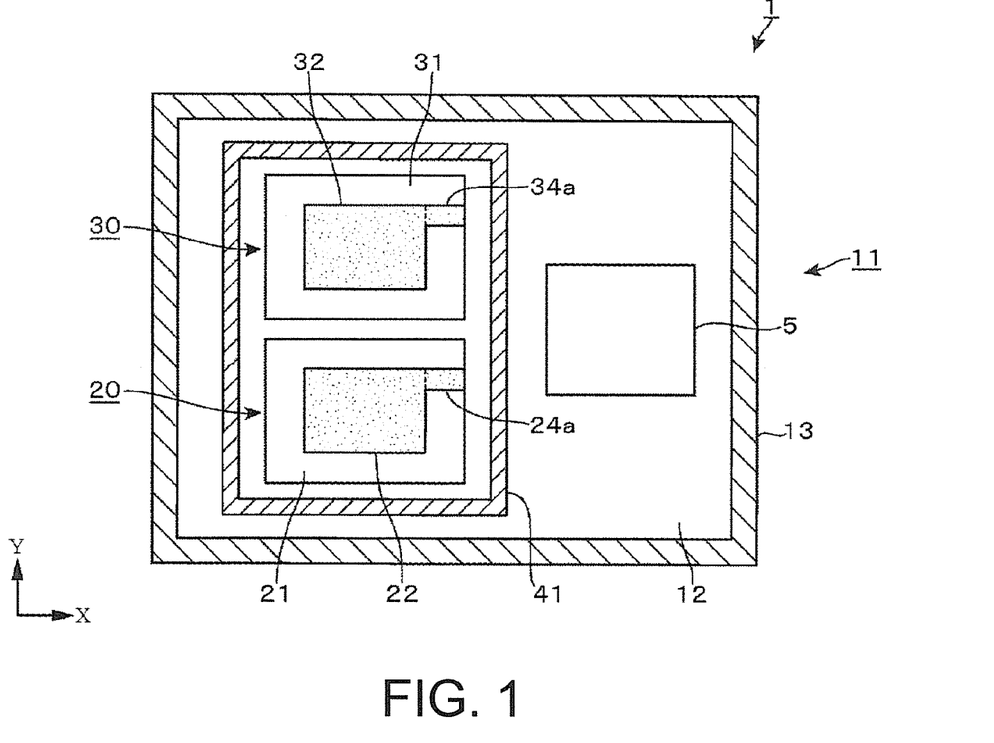
FIG. 1 is a plan view illustrating one example of an oscillation apparatus disclosed here.
Figure 2:
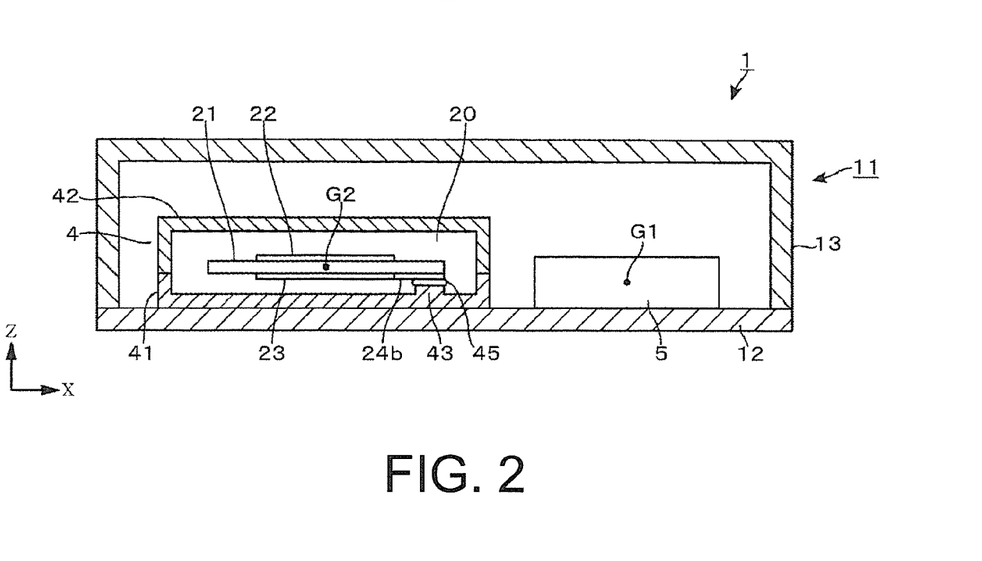
FIG. 2 is a longitudinal cross-sectional side view illustrating the oscillation apparatus.

FIG. 1 illustrates a first embodiment of a crystal oscillator that is an oscillation apparatus of this disclosure. FIG. 1 is a plan view of the oscillation apparatus. FIG. 2 is a longitudinal cross-sectional side view of the oscillation apparatus. X, Y, and Z in the drawings are coordinate axes of the orthogonal coordinate system. In FIG. 1, a container 11 is constituted of a printed circuit board 12 and a cover body 13 made of, for example, ceramics. A package 4 and an integrated circuit chip (IC chip) 5 are disposed on the top surface side of the printed circuit board 12. The package 4 stores crystal units 20 and 30, which will be described later. And, the integrated circuit chip (IC chip) 5 is an LSI. In the IC chip 5, oscillation circuits for the crystal units 20 and 30, and a circuit including a frequency difference detector and similar member for performing a digital processing are integrated as one chip.

Figure 3:
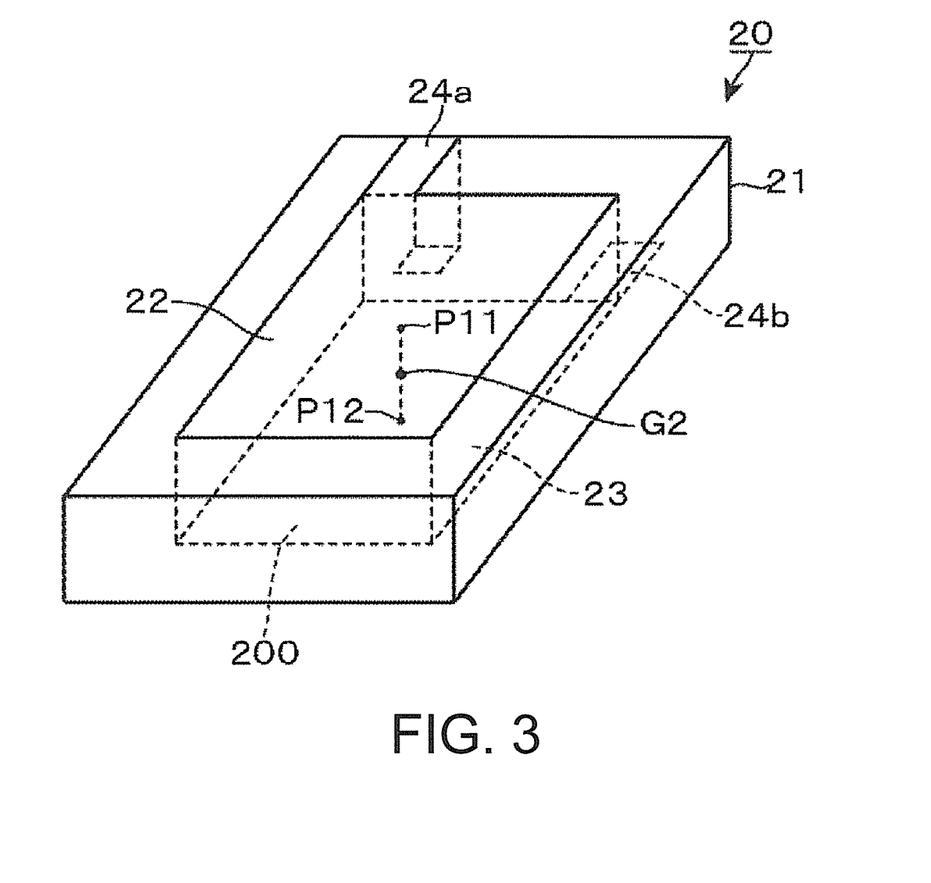
FIG. 3 is a perspective view illustrating a crystal unit.

The crystal units 20 and 30 will be described. In the drawings, crystal elements 21 and 31 are each, for example, an AT-cut strip-shaped crystal element. In this embodiment, the short side direction of the crystal elements 21 and 31 (the Y direction in FIG. 1) is assumed to be the right-left direction. As exemplarily illustrated in the first crystal unit 20 of FIG. 2 and FIG. 3, in the crystal elements 21 and 31, respective first excitation electrodes 22 and 23 and second excitation electrodes 32 and 33 (second excitation electrode 33 is not shown) for excitation are formed on both front and back surfaces. The first excitation electrodes 22 and 23 are formed to face each other across the crystal element 21 on the top and inferior surfaces of the crystal element 21. The second excitation electrodes 32 and 33 are formed to face each other across the crystal element 31 on the top and inferior surfaces of the crystal element 31. Thus, the first crystal unit 20 is constituted of the crystal element 21 and a pair of the excitation electrodes 22 and 23. The second crystal unit 30 is constituted of the crystal element 31 and a pair of the excitation electrodes 32 and 33. In the drawings, extraction electrodes 24a and 24b are extraction electrodes for the respective first excitation electrodes 22 and 23. Extraction electrodes 34a and 34b (extraction electrode 34b is not shown) are extraction electrodes of the respective second excitation electrodes 32 and 33. These extraction electrodes 24a, 24b, 34a, and 34b are extended to end areas of the crystal elements 21 and 31. In this example, the first excitation electrodes 22 and 23 and the second excitation electrodes 32 and 33 are formed to have the same shape and area.

The crystal elements 21 and 31 are mounted within the package 4 made of, for example, ceramics. As illustrated in FIG. 2, this package 4 is constituted of a base body 41 and a lid body 42. The base body 41 includes pedestal portions 43 and 44 (44 is not shown) that support the respective crystal elements 21 and 31. The crystal elements 21 and 31 are secured to the respective pedestal portions 43 and 44 at one end side by conductive adhesives 45.

The extraction electrodes 24a, 24b, 34a, and 34b connect to respective external electrodes (not shown) formed on the bottom surface of the base body 41 through conductive paths (not shown). The conductive paths vertically penetrate the respective pedestal portions 43 and 44 and the base body 41. The first crystal unit 20 connects to a first oscillation circuit 51 within the IC chip 5 via the external electrodes. The second crystal unit 30 connects to the second oscillation circuit 52 within the IC chip 5 via the external electrodes.

Subsequently, the IC chip 5 will be described. As illustrated in a block diagram of FIG. 4, this IC chip 5 includes, in its inside, the first oscillation circuit 51 connected to the first crystal unit 20, the second oscillation circuit 52 connected to the second crystal unit 30, a frequency difference detector 53, a temperature correction unit 54, a phase-locked loop (PLL) circuit unit 55, an analog-digital conversion unit (ADC) 56, and a memory 57. The output side of the PLL circuit unit 55 connects to a low-pass filter (LPF) 58 and a voltage-controlled oscillator (VCO) 59. The PLL circuit unit 55 uses the oscillation output from the first oscillation circuit 51 as a clock signal. The PLL circuit unit 55 converts a signal corresponding to a phase difference between a pulse signal and a feedback pulse from the voltage-controlled oscillator 59 into an analog signal, integrates the analog signal, and outputs the result to the low-pass filter 58. The pulse signal is generated based on a frequency setting signal that is a digital value. The output of the voltage-controlled oscillator 59 is an oscillation output of an oscillation apparatus 1. This oscillation output is fed back to the PLL circuit unit 55.

Figure 4:
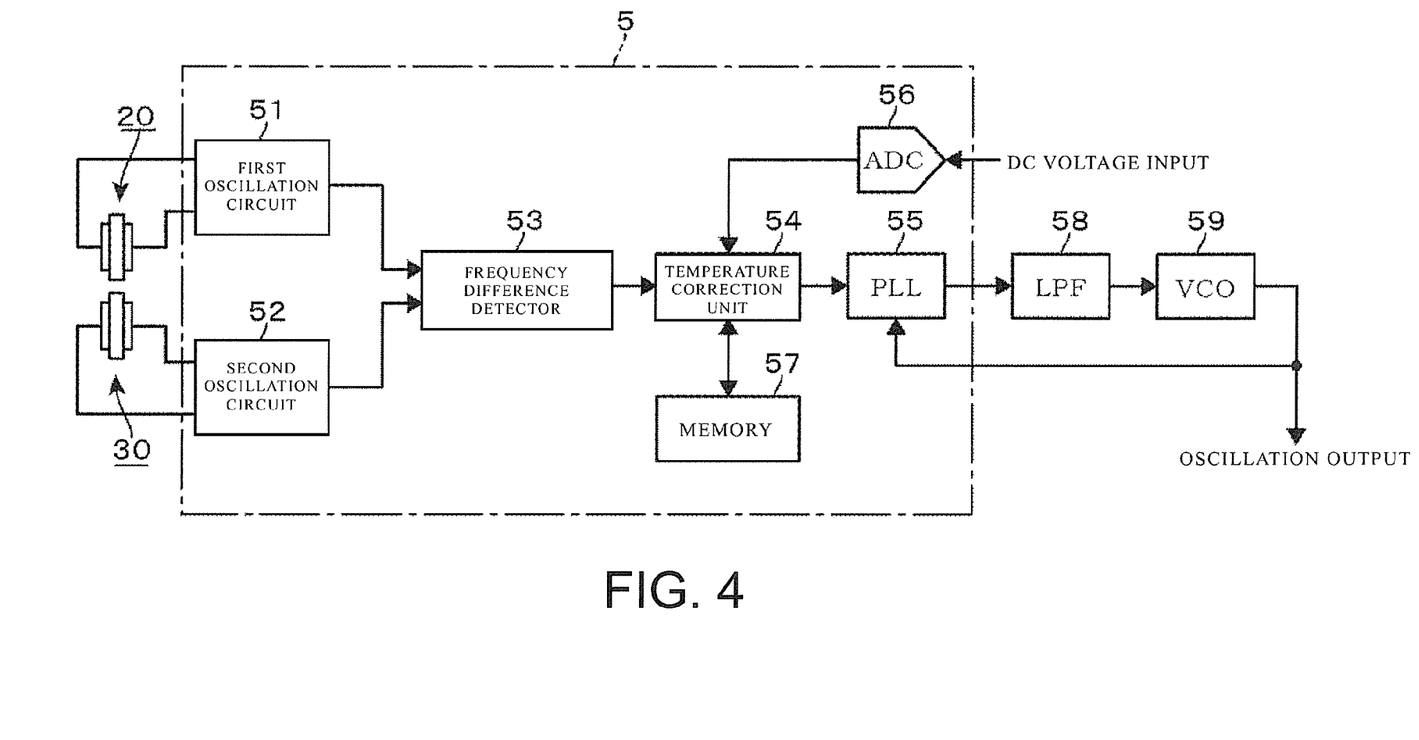
FIG. 4 is a block diagram illustrating the oscillation apparatus.

A value corresponding to a frequency difference f1−f2, which is between the oscillation output f1 from the first oscillation circuit 51 and the oscillation output f2 from the second oscillation circuit 52, corresponds to a temperature of the atmosphere where the crystal units 20 and 30 are placed. This value can be referred to as a temperature detection value. For convenience of explanation, the oscillation frequencies f1 and f2 also express respective oscillation frequencies of the first oscillation circuit 51 and the second oscillation circuit 52. The frequency difference detector 53 extracts a value of $\{(f2-f1)/f1\}-\{(f2r-f1r)/f1r\}$ in this example. This value corresponds to a temperature detection value in a proportional relationship to a temperature. The respective oscillation frequencies f1r and f2r are the oscillation frequency of the first oscillation circuit 51 and the oscillation frequency of the second oscillation circuit 52 at a reference temperature, for example, 25° C. The temperature correction unit 54 corresponds to a correction unit that corrects a setting value for the output frequency of the first oscillation circuit 51 based on a detection result of a temperature, and the detection result of the temperature is corresponding to the difference in oscillation frequency between the first oscillation circuit 51 and the second oscillation circuit 52. That is, the temperature correction unit 54 calculates the frequency correction value based on the temperature detection value and a pre-established relationship between the temperature detection value and the frequency correction value, and includes an addition unit that adds a frequency setting value and the correction value, so as to set the frequency setting signal. The relationship between the temperature detection value and the frequency correction value is stored in the memory 57. The correction value is a value for compensating change when the temperature of the first crystal unit 20 is changed from a target temperature, that is, change in temperature of the clock signal. This IC chip 5 is constituted to house an electronic circuit in a package made of, for example, ceramics. The package is formed in, for example, a flat rectangular parallelepiped shape. The IC chip 5 is constituted to have, for example, a quadrangular shape with a planar shape where each side is 1.0 mm or more and 2.0 mm or less, and has a thickness of about 0.4 mm to 1.0 mm.

Figure 5:
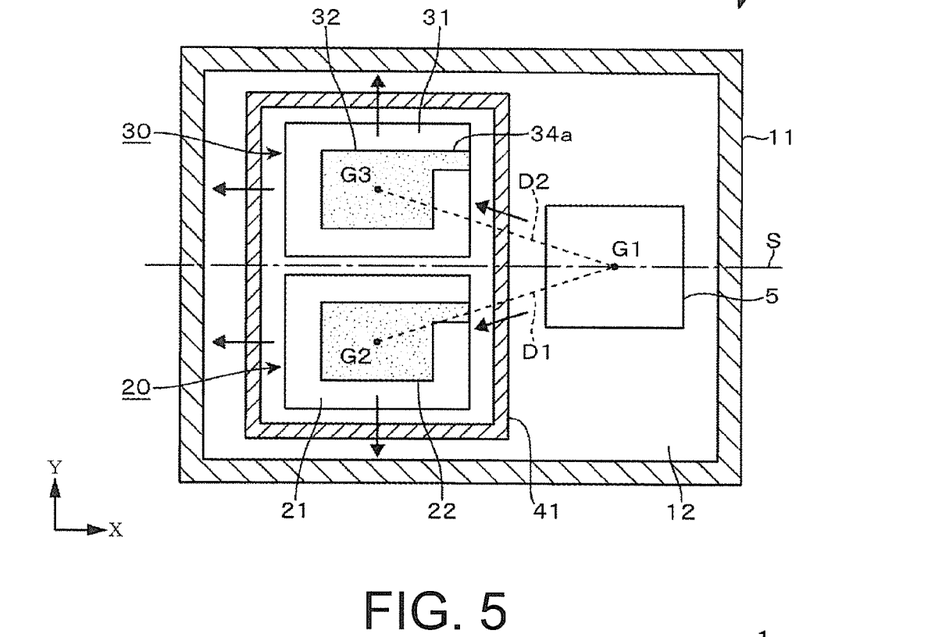
FIG. 5 is a plan view illustrating the oscillation apparatus.

The package 4 and the IC chip 5 are mounted with solder on the one surface side of the printed circuit board 12, and electrically connect to each other via wiring formed on the printed circuit board 12. In this example, the first excitation electrodes 22 and 23 and the second excitation electrodes 32 and 33 are arranged in bilaterally symmetrical positions within the container 11. In FIG. 5, a straight line S indicates a straight line at the same distance from respective gravity center positions G2 and G3 of the first excitation electrodes 22 and 23 and the second excitation electrodes 32 and 33 in plan view. The container 11 is symmetrical with respect to the straight line S in plan view. The IC chip 5 is disposed to be bilaterally symmetrical with respect to the straight line S in plan view.

The first excitation electrodes 22 and 23 are constituted similarly to the second excitation electrodes 32 and 33. Therefore, taking the gravity center position G2 of the first excitation electrodes 22 and 23 as an example, the gravity center positions G2 and G3 will be described by referring to FIG. 3. In the crystal unit 20, the area across which the excitation electrodes 22 and 23 face each other is a vibrating area 200. Therefore, the gravity center position of the first excitation electrodes 22 and 23 is the gravity center position of the vibrating area 200. The center position of a straight line connecting a gravity center P11 of the excitation electrode 22 on the one surface side and a gravity center P12 of the excitation electrode 23 on the other surface side is the gravity center position G2 of the first excitation electrodes 22 and 23. Since the IC chip 5 is constituted to have a rectangular parallelepiped shape, the gravity center position G1 can be obtained similarly.

By this arrangement, as illustrated in FIG. 5, the gravity center position G1 of the IC chip 5 is positioned on the straight line S in plan view. The gravity center position G2 of the first excitation electrodes 22 and 23 and the gravity center position G3 of the second excitation electrodes 32 and 33 are positioned at the same distance from the straight line S in bilaterally symmetrical positions. Accordingly, assuming that distances from the gravity center position G1 of the IC chip 5 to the respective gravity center positions G2 and G3 of the first excitation electrodes 22 and 23 and the second excitation electrodes 32 and 33 are denoted by D1 and D2, D1/D2 is 0.95 or more and 1.05 or less. Here, the distances D1 and D2 are designed to satisfy $0.95 \leq D1/D2 \leq 1.05$ because an error may occur in manufacture in the range of $0.95 \leq D1/D2 \leq 1.05$ even in the case where the distance D1 and the distance D2 are designed to be equal to each other (D1=D2).

Next, operation of the oscillation apparatus 1 will be described. The first crystal unit 20 and the first oscillation circuit 51 generate a frequency signal as the output of the oscillation apparatus 1, and also serve as a temperature detector together with the second crystal unit 30 and the second oscillation circuit 52. A value corresponding to the frequency difference between respective frequency signals obtained from the oscillation circuits 51 and 52 corresponds to the temperature as described above.

The output from the frequency difference detector 53 is input to the temperature correction unit 54. Then, a frequency correction amount that is temperature correction data is obtained. The frequency difference between the oscillation circuits 51 and 52 is a value accurately corresponding to the environmental temperature. Therefore, the output of the frequency difference detector 53 is temperature difference information between the environmental temperature and the reference temperature (25° C. in this example). The addition unit of the temperature correction unit 54 receives frequency data that includes a digital value corresponding to the setting value for setting the output frequency of the voltage-controlled oscillator 59. The frequency correction amount as the temperature correction data is added to the frequency data at the addition unit. Accordingly, frequency change in operation clock due to temperature change is compensated. As described above, the correction value obtained by the temperature correction unit 54 is used as a signal for compensating the change, so as to cancel change based on the frequency deviation amount of f1 due to deviation in temperature from 25° C.

Here, when the oscillation apparatus 1 operates, the IC generates heat and the heat is radiated through the package of the IC chip 5 to the printed circuit board 12. This heat is transferred to the crystal units 20 and 30 via the printed circuit board 12 as illustrated by, for example, solid arrows in FIG. 5, and is further transferred to the container 11. Accordingly, while the temperatures of the crystal units 20 and 30 are increased, the frequency deviation amount of f1 due to deviation in temperature from 25° C. is compensated as described above. This ensures a stable output frequency of the voltage-controlled oscillator 59 as the output of the oscillation apparatus 1, regardless of temperature change.

According to the above-described embodiment, the oscillation apparatus 1 is constituted such that the distance D1 and the distance D2 are equal to each other in plan view. The distance D1 is between the gravity center position G1 of the IC chip 5 and the gravity center position G2 of the first excitation electrode 22. And, the distance D2 is between the gravity center position G1 of the IC chip 5 and the gravity center position G3 of the second excitation electrode 32. Accordingly, when the IC chip 5 generates heat by operation of the oscillation apparatus 1, heat transfer from IC chip 5 occurs to the first excitation electrodes 22 and 23 (first vibrating area) and to the second excitation electrodes 32 and 33 (second vibrating area) in the same manner. This makes it difficult to generate a temperature difference between the first vibrating area and the second vibrating area, and ensures high accuracy of the detection result of the environmental temperature by operation based on the difference in oscillation frequency between the first crystal unit 20 and the second crystal unit 30. The temperature correction unit 54 corrects the setting value for the output frequency of the first oscillation circuit 51 based on the detection result of the environmental temperature. Therefore, the setting value for the output frequency is corrected with high accuracy in association with improvement of the accuracy of the detection result, and the oscillation frequency is stabilized.

The first crystal unit 20 and the second crystal unit 30 are arranged to be bilaterally symmetrical to each other with respect to the straight line S, and the container 11 is formed symmetrically with respect to the straight line S. Accordingly, heat of the first crystal unit 20 and heat of the second crystal unit 30 is transferred to the container 11 in the same manner. This reduces accumulation of heat from the IC chip 5 into one of the first crystal unit 20 and the second crystal unit 30, thus providing a state where the respective temperatures of the first crystal unit 20 and the second crystal unit 30 are more equal to each other. Also, when the outside temperature of the container 11 changes, heat exchange between the container 11 and the first crystal unit 20 and between the container 11 and the second crystal unit 30 occurs similarly. This makes it difficult to generate a temperature difference between the first and second crystal units 20 and 30. This allows correction with high accuracy when the outside temperature changes, thus stabilizing the oscillation frequency.

Second Embodiment

Figure 6:
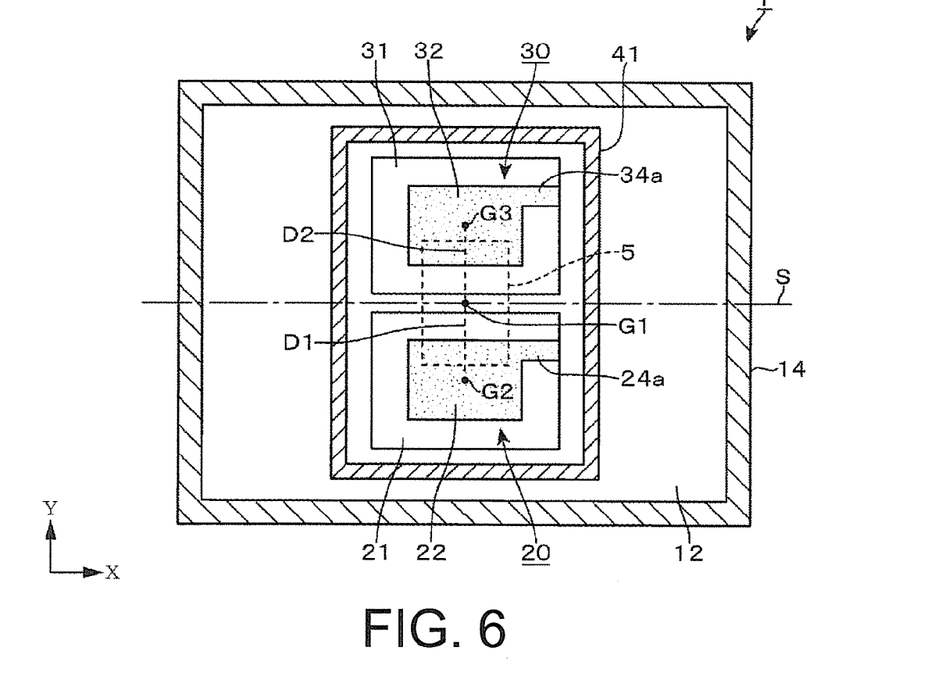
FIG. 6 is a plan view illustrating another example of the oscillation apparatus.
Figure 7:
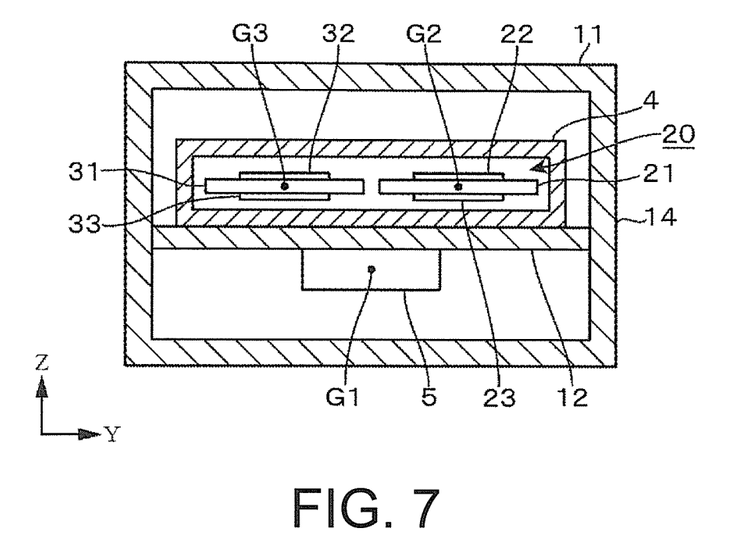
FIG. 7 is a longitudinal cross-sectional side view illustrating the oscillation apparatus.

This embodiment differs from the above-described embodiment in that, as illustrated in FIG. 6 and FIG. 7, the IC chip 5 is disposed on the back surface side of the printed circuit board 12 so as to face the package 4. The package 4, the first crystal unit 20, the second crystal unit 30, and similar member are constituted similarly to those in the first embodiment. The same reference numerals are given to the same configuration parts as the first embodiment, and the repeated description will be omitted correspondingly.

The package 4 and the IC chip 5 are respectively mounted with solder on the one surface side of the printed circuit board 12 and on the other surface side of the printed circuit board 12. The first excitation electrodes 22 and 23 and the second excitation electrodes 32 and 33 are arranged in bilaterally symmetrical positions within the container 11. The IC chip 5 is formed in a shape bilaterally symmetrical with respect to the straight line S, which is at the same distance from the respective gravity center positions G2 and G3 of the first excitation electrodes 22 and 23 and the second excitation electrodes 32 and 33, in plan view. The container 11 is formed in a shape bilaterally symmetrical with respect to the straight line in plan view. Accordingly, the distances D1 and D2 from the gravity center position G1 of the IC chip 5 to the respective gravity center positions G2 and G3 of the first excitation electrodes 22 and 23 and the second excitation electrodes 32 and 33 are designed to satisfy $0.95 \leq D1/D2 \leq 1.05$.

This embodiment also makes it difficult to generate a temperature difference between the first vibrating area and the second vibrating area, even when the IC chip 5 generates heat by operation of the oscillation apparatus 1. This allows correction of the setting value for the output frequency with high accuracy, thus stabilizing the oscillation frequency. When the IC chip 5 generates heat or when the outside temperature changes, heat exchange between the container 11 and the first crystal unit 20 and between the container 11 and the second crystal unit 30 occurs similarly. This makes it difficult to generate a temperature difference between a first vibrating area 200 and a second vibrating area 300. This allows correction of the setting value for the output frequency with high accuracy, thus stabilizing the oscillation frequency.

Figure 8:
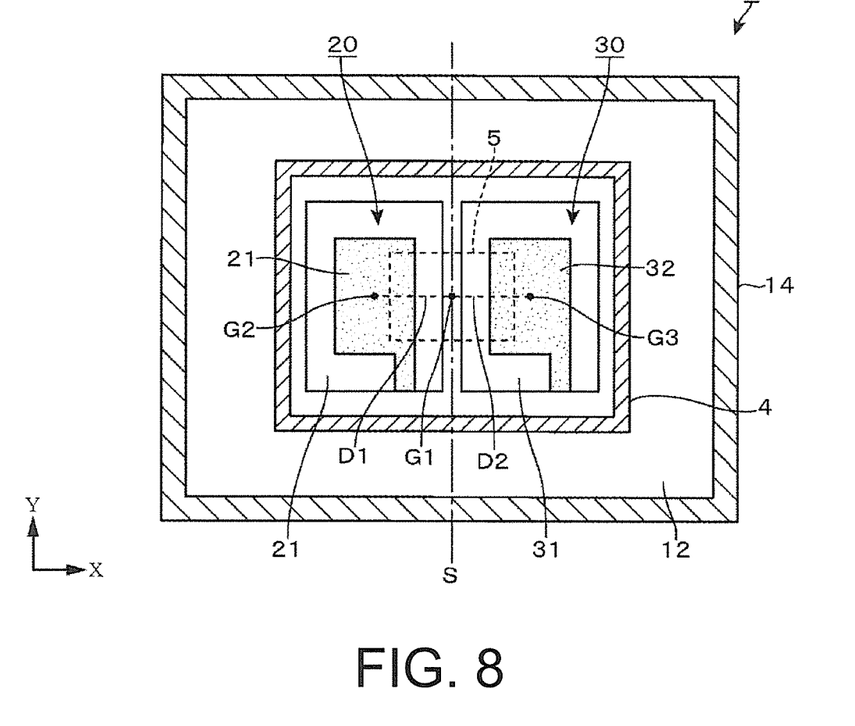
FIG. 8 is a plan view illustrating the oscillation apparatus.

FIG. 8 illustrates an example where the long side direction (the Y direction) of the first crystal unit 20 and the second crystal unit 30 is aligned with the short side direction of the container 11 in the oscillation apparatus of the second embodiment illustrated in FIG. 6 and FIG. 7. In this example, the short side direction of the crystal elements 21 and 31 (the X direction in FIG. 8) is assumed to be the right-left direction.

The first excitation electrodes 22 and 23 and the second excitation electrodes 32 and 33 are arranged in bilaterally symmetrical positions within the container 11. The IC chip 5 is formed in a shape bilaterally symmetrical with respect to the straight line S, which is at the same distance from the respective gravity center positions G2 and G3 of the first excitation electrodes 22 and 23 and the second excitation electrodes 32 and 33, in plan view. The container 11 is formed in a shape bilaterally symmetrical with respect to the straight line S in plan view. Accordingly, the distances D1 and D2 from the gravity center position G1 of the IC chip 5 to the respective gravity center positions G2 and G3 of the first excitation electrodes 22 and 23 and the second excitation electrodes 32 and 33 are designed to satisfy $0.95 \leq D1/D2 \leq 1.05$. FIG. 8 illustrates the gravity center positions G1, G2, G3, and G4 in plan view (similar figures are illustrated in FIG. 5, FIG. 6, FIG. 9, FIG. 12, and FIG. 14). This embodiment also provides effects similar to those in the first embodiment and the second embodiment.

Third Embodiment

In this embodiment, the oscillation apparatus of this disclosure is applied to an oven controlled oscillation apparatus (OCXO). An oscillation apparatus 6 in FIG. 9 and FIG. 10 includes, within a container 61, the first crystal unit 20, the second crystal unit 30, the IC chip 5, and a heater 7 as a heating unit for heating the inside of the container 61. In this example, the first crystal unit 20, the second crystal unit 30, and the IC chip 5 are disposed on the one surface side of the printed circuit board 12. Additionally, the heater 7 is disposed on the other surface side of the printed circuit board 12. The heater 7 has a function for heating the atmosphere within the container 61 (the crystal units 20 and 30) as a temperature-controlled object to the target temperature. The same reference numerals are given to the same configuration parts as the first embodiment, and the repeated description will be omitted correspondingly. In this example, the Y direction in FIG. 9 corresponds to the right-left direction.

Figure 9:
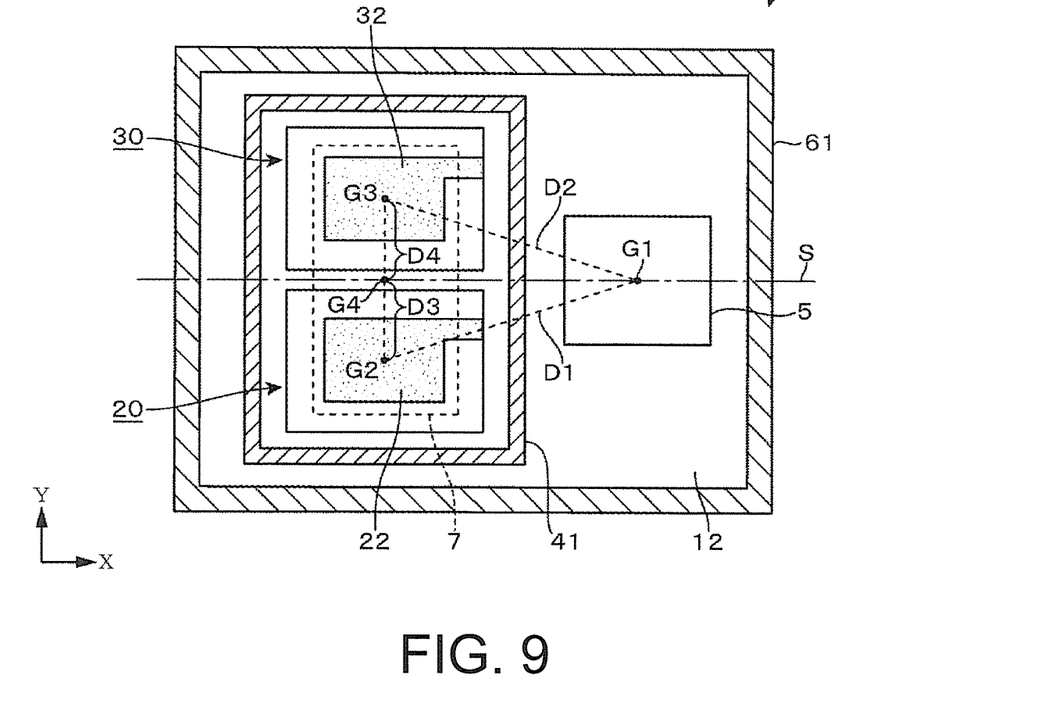
FIG. 9 is a plan view illustrating another example of the oscillation apparatus.
Figure 10:
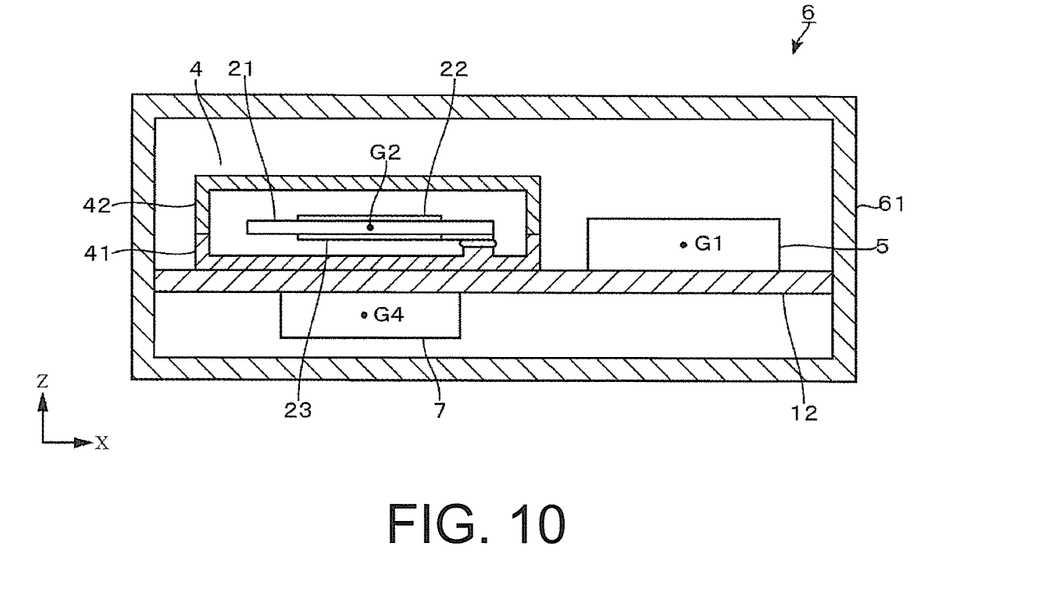
FIG. 10 is a longitudinal cross-sectional side view illustrating the oscillation apparatus.

The first excitation electrodes 22 and 23 and the second excitation electrodes 32 and 33 are arranged in bilaterally symmetrical positions within the container 61. The IC chip 5 is formed in a shape bilaterally symmetrical with respect to the straight line S, which is at the same distance from the respective gravity center positions G2 and G3 of the first excitation electrodes 22 and 23 and the second excitation electrodes 32 and 33, in plan view. Furthermore, the heater 7 and the container 61 are each formed in a shape bilaterally symmetrical with respect to the straight line S in plan view.

Accordingly, the distances D1 and D2 from the gravity center position G1 of the IC chip 5 to the respective gravity center positions G2 and G3 of the first excitation electrodes 22 and 23 and the second excitation electrodes 32 and 33 are designed to satisfy $0.95 \leq D1/D2 \leq 1.05$. In plan view, assuming that distances from the gravity center position G4 of the heater 7 to the respective gravity center positions G2 and G3 of the first excitation electrodes 22 and 23 and the second excitation electrodes 32 and 33 are denoted by D3 and D4, a relationship between these distances is designed to be $0.95 \leq D3/D4 \leq 1.05$.

Figure 11:
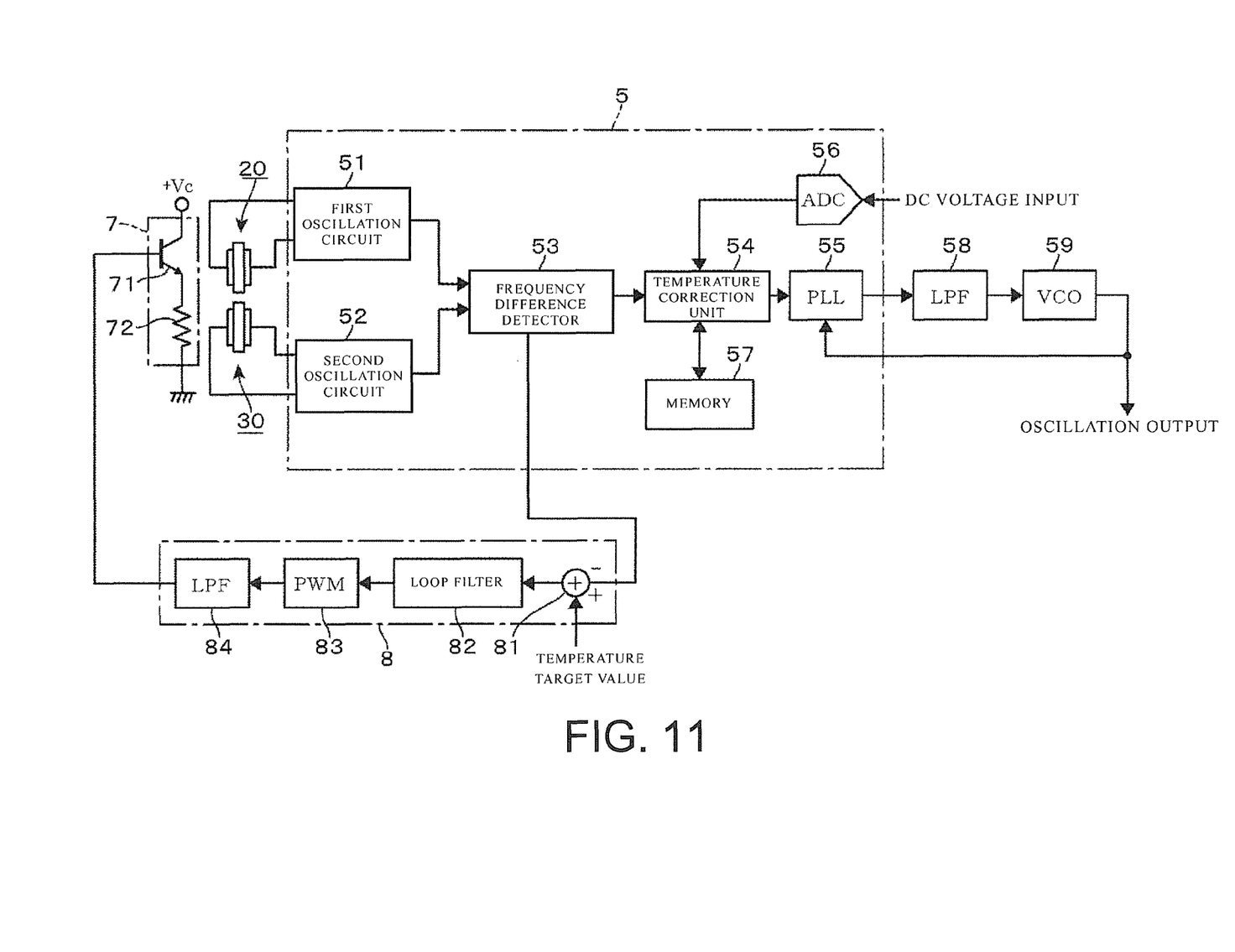
FIG. 11 is a block diagram illustrating the oscillation apparatus.

FIG. 11 illustrates a block diagram of this oscillation apparatus 6. In this example, the temperature detection value is used for controlling heat generation of the heater 7 so as to maintain the crystal units 20 and 30 at the target temperature.

Therefore, the oscillation apparatus 6 of this embodiment is what is called an integrated apparatus of an oven-controlled oscillation apparatus (OCXO) and a temperature-controlled oscillation apparatus (TCXO).

The heater 7 includes a transistor 71 and a resistor 72. For example, the transistor 71 includes a base connected to the output terminal of a low-pass filter 84 and a collector that receives voltage from a power source portion Vc. The resistor 72 is connected between an emitter of this transistor 71 and the earth. The relationship between: the voltage supplied to the base of the transistor 71, and the total electric power of the power consumption of the transistor 71 and the power consumption of the resistor 72, has a linear relationship. The heat generation temperature is linearly controlled corresponding to a difference between a temperature detection value and a temperature target value. In a heater control circuit 8, the temperature detection value (digital value) output from the frequency difference detector 53 is added to a digital value corresponding to the temperature target value at an addition unit 81. The digital value from the addition unit 81 is integrated at a loop filter 82, and then a pulse width modulation (PWM) wave interpolation unit 83 outputs a PWM pulse corresponding to this integral value for a certain period of time. This pulse is averaged at the low-pass filter 84. Accordingly, an analog voltage corresponding to the digital value from the loop filter 82 is obtained from the low-pass filter 84. Adding the temperature detection value to the digital value corresponding to the temperature target value at the addition unit 81 allows the low-pass filter 84 to output the analog voltage. Thus, a control voltage is input to the heater 7. Therefore, in this example, the signal corresponding to the difference in oscillation frequency between the first crystal unit 20 and the second crystal unit 30 is treated as the temperature detection value. Based on this detected value, the frequency setting value is corrected and the heater 7 is controlled. In this example, the frequency difference detector 53 and the heater control circuit 8 correspond to a correction unit.

In this embodiment, the heater 7 and the IC chip 5 are heat generation sources. The first excitation electrodes 22 and 23 (the first vibrating area) and the second excitation electrodes 32 and 33 (the second vibrating area) are disposed in positions at the same distance from these heat generation sources. Accordingly, the heat of the heat generation source is transferred to the first excitation electrodes 22 and 23 and to the second excitation electrodes 32 and 33 in the same manner. This makes it difficult to generate a temperature difference between the first vibrating area and the second vibrating area, thus ensuring high reliability of the temperature detection value. This allows correction of the setting value for the output frequency with high accuracy, thus stabilizing the oscillation frequency. Additionally, high accuracy of the temperature detection value allows controlling the heater 7 with high accuracy based on this temperature detection value, thus increasing the stability of the oscillation frequency.

Fourth Embodiment

Figure 12:
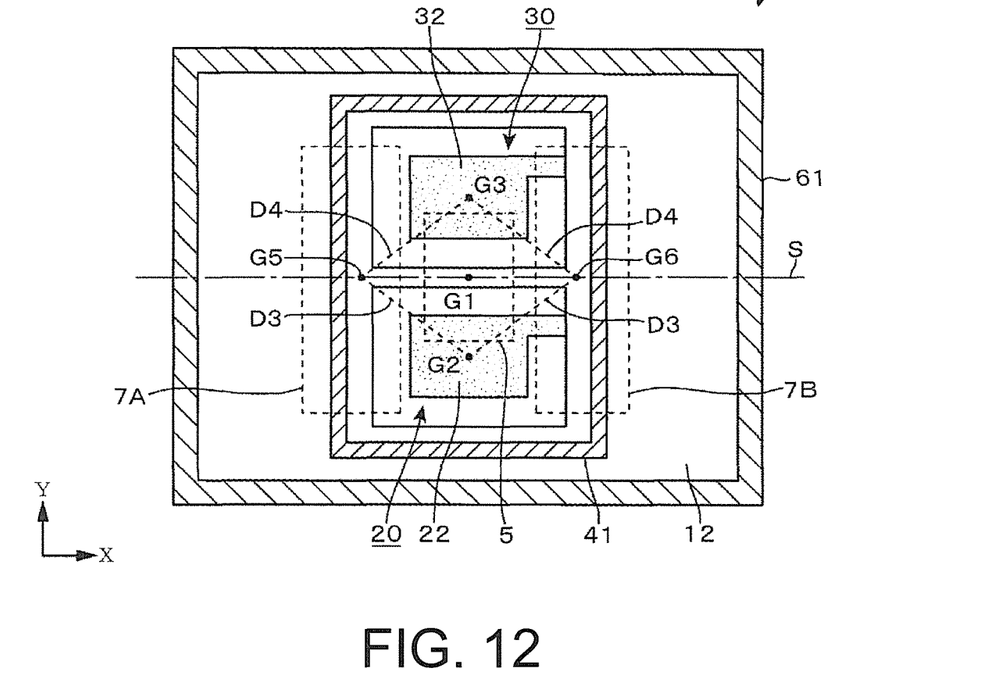
FIG. 12 is a plan view illustrating another example of the oscillation apparatus.
Figure 13:
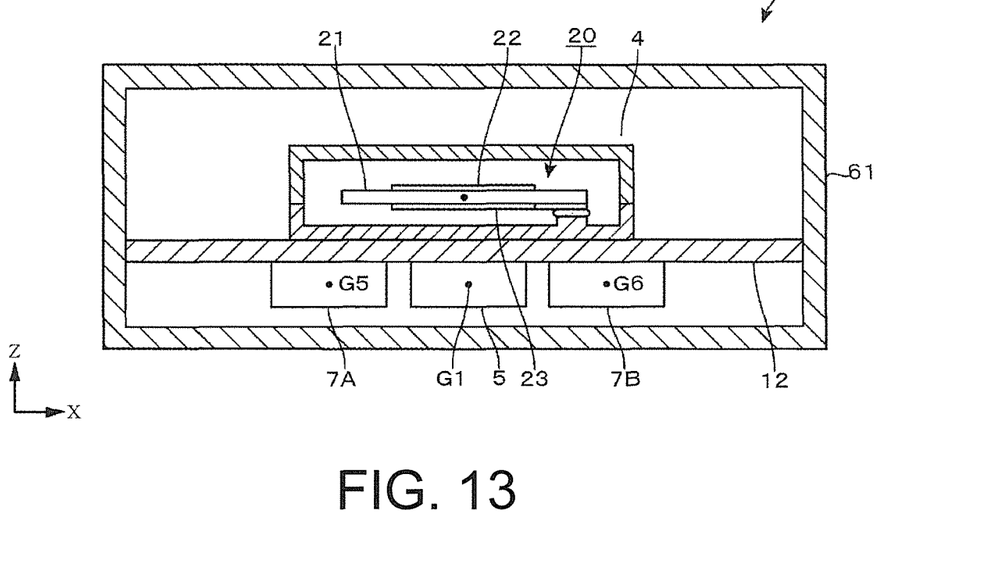
FIG. 13 is a longitudinal cross-sectional side view illustrating the oscillation apparatus.

This embodiment differs from the above-described third embodiment in that, as illustrated in FIG. 12 and FIG. 13, the IC chip 5 is disposed on the back surface side of the printed circuit board 12, a plurality of heaters 7A and 7B are prepared, and the heaters 7A and 7B are disposed on the back surface side of the printed circuit board 12. The same reference numerals are given to the same configuration parts as the first embodiment, and the repeated description will be omitted correspondingly.

The first excitation electrodes 22 and 23 and the second excitation electrodes 32 and 33 are arranged in bilaterally symmetrical positions within the container 61. The IC chip 5 has a shape bilaterally symmetrical with respect to the straight line S, which is at the same distance from the respective gravity center positions G2 and G3 of the first excitation electrodes 22 and 23 and the second excitation electrodes 32 and 33, in plan view. The heaters 7A and 7B and the container 61 are each formed in a shape bilaterally symmetrical with respect to the straight line S in plan view.

Accordingly, the distances D1 and D2 from the gravity center position G1 of the IC chip 5 to the respective gravity center positions G2 and G3 of the first excitation electrodes 22 and 23 and the second excitation electrodes 32 and 33 are designed to satisfy $0.95 \leq D1/D2 \leq 1.05$. Respective gravity center positions G5 and G6 of the plurality of heaters 7A and 7B are designed in positions at the same distance from the respective gravity center positions G2 and G3 of the first excitation electrodes 22 and 23 and the second excitation electrodes 32 and 33. That is, in plan view, the distance (D3) between the gravity center position G5 of the heater 7A and the gravity center position G2 of the first excitation electrodes 22 and 23 and the distance (D3) between the gravity center position G6 of the heater 7B and the gravity center position G2 of the first excitation electrodes 22 and 23 are equal to each other. The distance (D4) between the gravity center position G5 of the heater 7A and the gravity center position G3 of the second excitation electrodes 32 and 33 and the distance (D4) between the gravity center position G6 of the heater 7B and the gravity center position G3 of the second excitation electrodes 32 and 33 are equal to each other. Here, the expression "equal to each other" means that, taking the error range in manufacture into consideration, when the distances D3 (D4) is compared with each other, a relationship of one distance D3 (D4) to the other distance D3 (D4) satisfies 0.95 D3 (D4) or more and 1.05 D3 (D4) or less. Accordingly, assuming that distances from the gravity center positions G5 and G6 of the heaters 7A and 7B to the respective gravity center positions G2 and G3 of the first excitation electrodes 22 and 23 and the second excitation electrodes 32 and 33 are denoted by D3 and D4, a relationship between these distances is designed to be $0.95 \leq D3/D4 \leq 1.05$.

Also in this embodiment, the first excitation electrodes 22 and 23 (the first vibrating area) and the second excitation electrodes 32 and 33 (the second vibrating area) are disposed in positions at the same distance from the respective heaters 7A and 7B as heat generation sources and the IC chip 5. Accordingly, the temperature difference between the first vibrating area and the second vibrating area does not easily occur, and thus the reliability of the temperature detection value is high. This allows correction of the setting value for the output frequency with high accuracy, thus stabilizing the oscillation frequency. The heaters 7A and 7B are controlled with high accuracy based on the temperature detection value. This increases the stability of the oscillation frequency.

Figure 14:
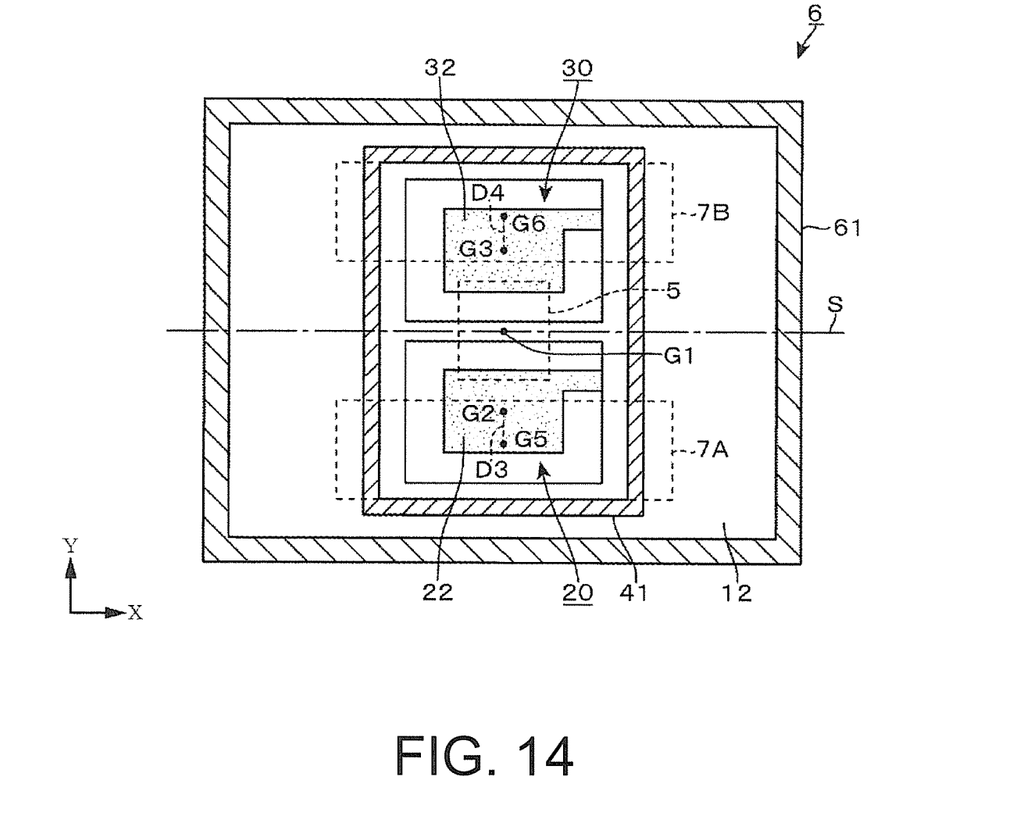
FIG. 14 is a plan view illustrating another example of the oscillation apparatus.

In the above-described configuration, as illustrated in FIG. 14, the heaters 7A and 7B may be arranged to be bilaterally symmetrical with respect to the straight line S in plan view. Also in this case, the IC chip 5 and the heaters 7A and 7B are both formed in a shape bilaterally symmetrical with respect to the straight line S in plan view. The distances D1 and D2 from the gravity center position G1 of the IC chip 5 to the respective gravity center positions G2 and G3 of the first excitation electrodes 22 and 23 and the second excitation electrodes 32 and 33 are designed to satisfy $0.95 \leq D1/D \leq 1.05$. The gravity center positions G5 and G6 of the respective plurality of heaters 7A and 7B are designed in positions at the same distance from the respective gravity center positions G2 and G3 of the first excitation electrodes 22 and 23 and the second excitation electrodes 32 and 33. That is, in plan view, the distance the gravity center position G5 of the heater 7A and the gravity center position G2 of the first excitation electrodes 22 and 23 and the distance between the gravity center position G6 of the heater 7B and the gravity center position G3 of the second excitation electrode 32 and 33 are equal to each other. The distance between the gravity center position G5 of the heater 7A and the gravity center position G3 of the second excitation electrodes 32 and 33 and the distance between the gravity center position G6 of the heater 7B and the gravity center position G2 of the first excitation electrodes 22 and 23 are equal to each other. Accordingly, assuming that the distance from the gravity center position G5 of the heater 7A to the gravity center position G2 of the first excitation electrode 22 and 23 is the distance D3 and that the distance from the gravity center position G6 of the heater 7B to the gravity center position G3 of the second excitation electrodes 32 and 33 is the distance D4, a relationship between these distances is designed to be $0.95 \leq D3/D4 \leq 1.05$. Assuming that the distance from the gravity center position G5 of the heater 7A to the gravity center position G3 of the second excitation electrodes 32 and 33 is the distance D5 and that the distance from the gravity center position G6 of the heater 7B to the gravity center position G2 of the first excitation electrodes 22 and 23 is the distance D6, a relationship between these distances is designed to be $0.95 \leq D5/D6 \leq 1.05$.

In the above-described configuration, the first crystal element and the second crystal element need not to have the same shape or the same area. Similarly, the first excitation electrode and the second excitation electrode need not to have the same shape or the same area. In this case, in case of the TCXO, assuming that distances from the gravity center position of the integrated circuit chip to the respective gravity center positions of the first excitation electrode and the second excitation electrode in plan view are denoted by D1 and D2, simply designing 0.95 or more and 1.05 or less of D1/D2 ensures advantageous effects of this disclosure.

In case of the OCXO, assuming that distances from the gravity center position of the integrated circuit chip to the respective gravity center positions of the first excitation electrode and the second excitation electrode are denoted by D1 and D2, it is only necessary to design D1/D2 to be 0.95 or more and 1.05 or less. Additionally, assuming that distances from the gravity center position of the heating unit to the respective gravity center positions of the first excitation electrode and the second excitation electrode in plan view are denoted by D3 and D4, it is only necessary to design D3/D4 to be 0.95 or more and 1.05 or less. Since the vibrating area is disposed between the excitation electrodes facing each other, satisfying the above-described conditions makes the distances between the heat generation source and the respective vibrating areas equal to each other, thus suppressing generation of a temperature difference between the respective vibrating areas.

The numerical range of equal to or more than 0.95 and equal to or less than 1.05 is designed based on a manufacturing error assuming a predetermined manufacturing process. Thus, the numerical range is not limited to this range and may vary depending on the manufacturing processes. Thus, the numerical range of D1/D2 and D3/D4 may be any range insofar as the range is close to 1 and designed based on a predetermined manufacturing process.

The shape of the excitation electrode is not limited to a rectangular shape, and may be a circular shape or another shape. Furthermore, the excitation electrode on the one surface side and the excitation electrode on the other surface side may have mutually different shapes. In this case, the gravity center position of the area across which the excitation electrode on the one surface side and the excitation electrode on the other surface side face each other corresponds to the gravity center position of the excitation electrodes of this disclosure. Furthermore, the OCXO may employ a thermistor or similar detector as the temperature detector. Additionally, respective first excitation electrodes and second excitation electrodes may be disposed on both surfaces of a common crystal element to form a first crystal unit and a second crystal unit.

An oven-controlled oscillation apparatus of this disclosure heats an inside of a container that houses crystal units by a heating unit. The oscillation apparatus includes a first crystal unit, a second crystal unit, a temperature detector, and an integrated circuit chip. The first crystal unit is constituted such that first excitation electrodes are disposed on both respective surfaces of a crystal element. The second crystal unit is constituted such that second excitation electrodes are disposed on both respective surfaces of a crystal element. The temperature detector is configured to detect a temperature of the first crystal unit. The integrated circuit chip is arranged within the container. The integrated circuit chip includes a first oscillation circuit, a second oscillation circuit, and a correction unit. The first oscillation circuit and the second oscillation circuit are respectively connected to the first crystal unit and the second crystal unit. The correction unit is configured to correct a setting value for the heating unit based on a detection result of the temperature detector. Assuming that distances from a gravity center position of the integrated circuit chip to respective gravity center positions of the first excitation electrodes and the second excitation electrodes in plan view are denoted by D1 and D2, D1/D2 is 0.95 or more and 1.05 or less. Assuming that distances from a gravity center position of the heating unit to the respective gravity center positions of the first excitation electrodes and the second excitation electrodes in plan view are denoted by D3 and D4, D3/D4 is 0.95 or more and 1.05 or less.

According to this disclosure, in the oscillation apparatus where the first crystal unit, the second crystal unit, and the integrated circuit chip are housed within the container, assuming that distances from the gravity center position of the integrated circuit chip to the respective gravity center positions of the first excitation electrodes and the second excitation electrodes in plan view are denoted by D1 and D2, D1/D2 is designed to be 0.95 or more and 1.05 or less. Although the integrated circuit chip generates heat by operation of the oscillation apparatus, heat from the integrated circuit chip is transferred to the first excitation electrode and the second excitation electrode in the same manner because the integrated circuit chip is disposed in the position at the same distance from the first excitation electrode and the second excitation electrode. This suppresses generation of a temperature difference between the first excitation electrode and the second excitation electrode, and increases the accuracy of the setting value for the output frequency corrected based on the difference in oscillation frequency between the first crystal unit and the second crystal unit, thus stabilizing the oscillation frequency.

According to another disclosure of this disclosure, in the oscillation apparatus where the first crystal unit, the second crystal unit, the integrated circuit chip, and the heating unit are housed within the container, assuming that distances from the gravity center position of the integrated circuit chip to the respective gravity center positions of the first excitation electrodes and the second excitation electrodes in plan view are denoted by D1 and D2, D1/D2 is designed to be 0.95 or more and 1.05 or less. Assuming that distances from the gravity center position of the heating unit to the respective gravity center positions of the first excitation electrodes and the second excitation electrodes in plan view are denoted by D3 and D4, D3/D4 is designed to be 0.95 or more and 1.05 or less. Accordingly, heat of the heating unit and heat of the integrated circuit chip is transferred to the first excitation electrode and the second excitation electrode in the same manner. This makes it difficult to generate a temperature difference between the first excitation electrode and the second excitation electrode. Accordingly, the oscillation frequencies of the first crystal unit and the second crystal unit have high accuracy by reducing occurrence of errors due to temperature. This stabilizes the oscillation frequency.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An oscillation apparatus for correcting a setting value for an output frequency based on a detection result of an environmental temperature, the oscillation apparatus comprising:
    a first crystal unit, that includes first excitation electrodes on respective surfaces of a first crystal element;
    a second crystal unit, that includes second excitation electrodes on respective surfaces of a second crystal element;
    an integrated circuit chip, that includes:
        a first oscillation circuit and a second oscillation circuit, respectively connected to the first crystal unit and the second crystal unit; and
        a correction unit, configured to provide a signal corresponding to a difference in oscillation frequency between the first oscillation circuit and the second oscillation circuit as a detection result of a temperature and to correct a setting value for an output frequency of the first oscillation circuit based on the detection result; and
    a container, that houses the first crystal unit, the second crystal unit, and the integrated circuit chip, wherein
    distances from a gravity center position of the integrated circuit chip to respective gravity center positions of the first excitation electrodes and the second excitation electrodes in plan view are denoted by D1 and D2, D1/D2 is within a predetermined range close to 1.

2. The oscillation apparatus according to claim 1, wherein the D1/D2 is 0.95 or more and 1.05 or less.

3. The oscillation apparatus according to claim 1, wherein the first excitation electrodes and the second excitation electrodes are each formed to have a same shape and a same area, the first excitation electrodes and the second excitation electrodes being arranged in bilaterally symmetrical positions within the container, and
    the integrated circuit chip has a shape bilaterally symmetrical with respect to a straight line at a same distance from the respective gravity center positions of the first excitation electrodes and the second excitation electrodes in plan view.

4. The oscillation apparatus according to claim 2, wherein the first excitation electrodes and the second excitation electrodes are each formed to have a same shape and a same area, the first excitation electrodes and the second excitation electrodes being arranged in bilaterally symmetrical positions within the container, and
    the integrated circuit chip has a shape bilaterally symmetrical with respect to a straight line at a same distance from the respective gravity center positions of the first excitation electrodes and the second excitation electrodes in plan view.

5. An oven-controlled oscillation apparatus for heating an inside of a container that houses crystal units by a heating unit, the oscillation apparatus comprising:
    a first crystal unit, that includes first excitation electrodes on respective surfaces of a first crystal element;
    a second crystal unit, that includes second excitation electrodes on respective surfaces of a second crystal element;
    a temperature detector, configured to detect a temperature of the first crystal unit; and
    an integrated circuit chip, arranged within the container, wherein
    the integrated circuit chip includes:
        a first oscillation circuit and a second oscillation circuit, respectively connected to the first crystal unit and the second crystal unit; and
        a correction unit, configured to correct a setting value for the heating unit based on a detection result of the temperature detector so as to make a temperature of the first crystal unit a set temperature, wherein
    distances from a gravity center position of the integrated circuit chip to respective gravity center positions of the first excitation electrodes and the second excitation electrodes in plan view are denoted by D1 and D2, D1/D2 is within a first predetermined range close to 1, and
    distances from a gravity center position of the heating unit to the respective gravity center positions of the first excitation electrodes and the second excitation electrodes in plan view are denoted by D3 and D4, D3/D4 is within a second predetermined range close to 1.

6. The oscillation apparatus according to claim 5, wherein the D1/D2 is 0.95 or more and 1.05 or less.

7. The oscillation apparatus according to claim 5, wherein the D3/D4 is 0.95 or more and 1.05 or less.

8. The oscillation apparatus according to claim 6, wherein the D3/D4 is 0.95 or more and 1.05 or less.

9. The oscillation apparatus according to claim 5, wherein the first excitation electrodes and the second excitation electrodes are each formed to have a same shape and a same area, the first excitation electrodes and the second excitation electrodes being arranged in bilaterally symmetrical positions within the container, and
    the integrated circuit chip and the heating unit each have a shape bilaterally symmetrical with respect to a straight line at a same distance from the respective gravity center positions of the first excitation electrodes and the second excitation electrodes in plan view.

10. The oscillation apparatus according to claim 6, wherein the first excitation electrodes and the second excitation electrodes are each formed to have a same shape and a same area, the first excitation electrodes and the second excitation electrodes being arranged in bilaterally symmetrical positions within the container, and
    the integrated circuit chip and the heating unit each have a shape bilaterally symmetrical with respect to a straight line at a same distance from the respective gravity center positions of the first excitation electrodes and the second excitation electrodes in plan view.

11. The oscillation apparatus according to claim 7, wherein
the first excitation electrodes and the second excitation electrodes are each formed to have a same shape and a same area, the first excitation electrodes and the second excitation electrodes being arranged in bilaterally symmetrical positions within the container, and the integrated circuit chip and the heating unit each have a shape bilaterally symmetrical with respect to a straight line at a same distance from the respective gravity center positions of the first excitation electrodes and the second excitation electrodes in plan view.

12. The oscillation apparatus according to claim 8, wherein
the first excitation electrodes and the second excitation electrodes are each formed to have a same shape and a same area, the first excitation electrodes and the second excitation electrodes being arranged in bilaterally symmetrical positions within the container, and the integrated circuit chip and the heating unit each have a shape bilaterally symmetrical with respect to a straight line at a same distance from the respective gravity center positions of the first excitation electrodes and the second excitation electrodes in plan view.

13. The oscillation apparatus according to claim 3, wherein
the container is symmetrical with respect to the straight line in plan view.

14. The oscillation apparatus according to claim 4, wherein
the container is symmetrical with respect to the straight line in plan view.

15. The oscillation apparatus according to claim 9, wherein
the container is symmetrical with respect to the straight line in plan view.

16. The oscillation apparatus according to claim 10, wherein
the container is symmetrical with respect to the straight line in plan view.

17. The oscillation apparatus according to claim 11, wherein
the container is symmetrical with respect to the straight line in plan view.

18. The oscillation apparatus according to claim 12, wherein
the container is symmetrical with respect to the straight line in plan view.

\* \* \* \* \*